United States Patent
Tångring et al.

(10) Patent No.: US 9,306,114 B2
(45) Date of Patent: Apr. 5, 2016

(54) III-V COMPOUND SEMICONDUCTOR-BASED-LIGHT-EMITTING DIODE DEVICE WITH EMBEDDED CHARGE CARRIER BARRIER

(71) Applicant: OSRAM Opto Semiconductors GmbH, Regensburg (DE)

(72) Inventors: Ivar Tångring, Regensburg (DE); Jens Ebbecke, Rohr In Niederbayern (DE); Ines Pietzonka, Donaustauf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/420,197

(22) PCT Filed: Aug. 8, 2013

(86) PCT No.: PCT/EP2013/066656
§ 371 (c)(1),
(2) Date: Feb. 6, 2015

(87) PCT Pub. No.: WO2014/029633
PCT Pub. Date: Feb. 27, 2014

(65) Prior Publication Data
US 2015/0200328 A1 Jul. 16, 2015

(30) Foreign Application Priority Data
Aug. 23, 2012 (DE) .......................... 10 2012 107 795

(51) Int. Cl.
*H01L 33/30* (2010.01)
*H01L 33/60* (2010.01)
(Continued)

(52) U.S. Cl.
CPC ............ *H01L 33/0025* (2013.01); *H01L 33/06* (2013.01); *H01L 33/14* (2013.01); *H01L 33/145* (2013.01); *H01L 33/30* (2013.01); *H01L 33/60* (2013.01); *H01L 2924/0002* (2013.01)

(58) Field of Classification Search
CPC ..... Y10S 438/973; H01L 33/16; H01L 33/30; H01L 33/145; H01L 33/0062
USPC ................... 257/13, 79, 89, E33.003
See application file for complete search history.

(56) References Cited

U.S. PATENT DOCUMENTS 5,555,271 A 9/1996 Honda et al.
5,831,277 A 11/1998 Razeghi
(Continued)

FOREIGN PATENT DOCUMENTS

DE 20019477 1/2002
DE 102006046237 1/2008
(Continued)

OTHER PUBLICATIONS

English translation of the Notification of Reasons for Refusal dated Jan. 5, 2016 of corresponding Japanese Application No. 2015-527848.
(Continued)

*Primary Examiner* — Evan Pert
*Assistant Examiner* — Changhyun Yi
(74) *Attorney, Agent, or Firm* — DLA Piper LLP (US)

(57) ABSTRACT

An optoelectronic semiconductor body includes a semiconductor layer sequence having an active region that generates radiation, a first barrier region and a second barrier region, wherein the active region is arranged between the first barrier region and the second barrier region; and at least one charge carrier barrier layer is arranged in the first barrier region, said at least one charge carrier barrier layer being tensile-strained.

14 Claims, 7 Drawing Sheets

(51) Int. Cl.
*H01L 33/00* (2010.01)
*H01L 33/14* (2010.01)
*H01L 33/06* (2010.01)

(56) References Cited

U.S. PATENT DOCUMENTS

| | | |
|---|---|---|
| 6,785,311 B1 | 8/2004 | Najda |
| 2002/0104996 A1* | 8/2002 | Kuo et al. ........................ 257/79 |
| 2009/0302307 A1* | 12/2009 | Gronninger et al. ............ 257/13 |
| 2011/0272667 A1 | 11/2011 | Takayama |

FOREIGN PATENT DOCUMENTS

| | | |
|---|---|---|
| EP | 1521311 | 4/2005 |
| JP | 07-235733 | 9/1995 |
| JP | 10-294524 | 11/1998 |
| JP | 2002-532908 | 10/2002 |

OTHER PUBLICATIONS

Streubel, K., et al., "High Brightness AlGaInP Light-Emitting Diodes," *IEEE Journal on Selected Topics in Quantum Electronics*, vol. 8, No. 2, Mar./Apr. 2002, pp. 321-332.

Chang, S. J., et al., "AlGaInP Yellow-Green Light-Emitting Diodes with a Tensile Strain Barrier Cladding Layer," *IEEE Photonics Technology Letters*, vol. 9, No. 9, Sep. 1997, pp. 1199-1201.

* cited by examiner

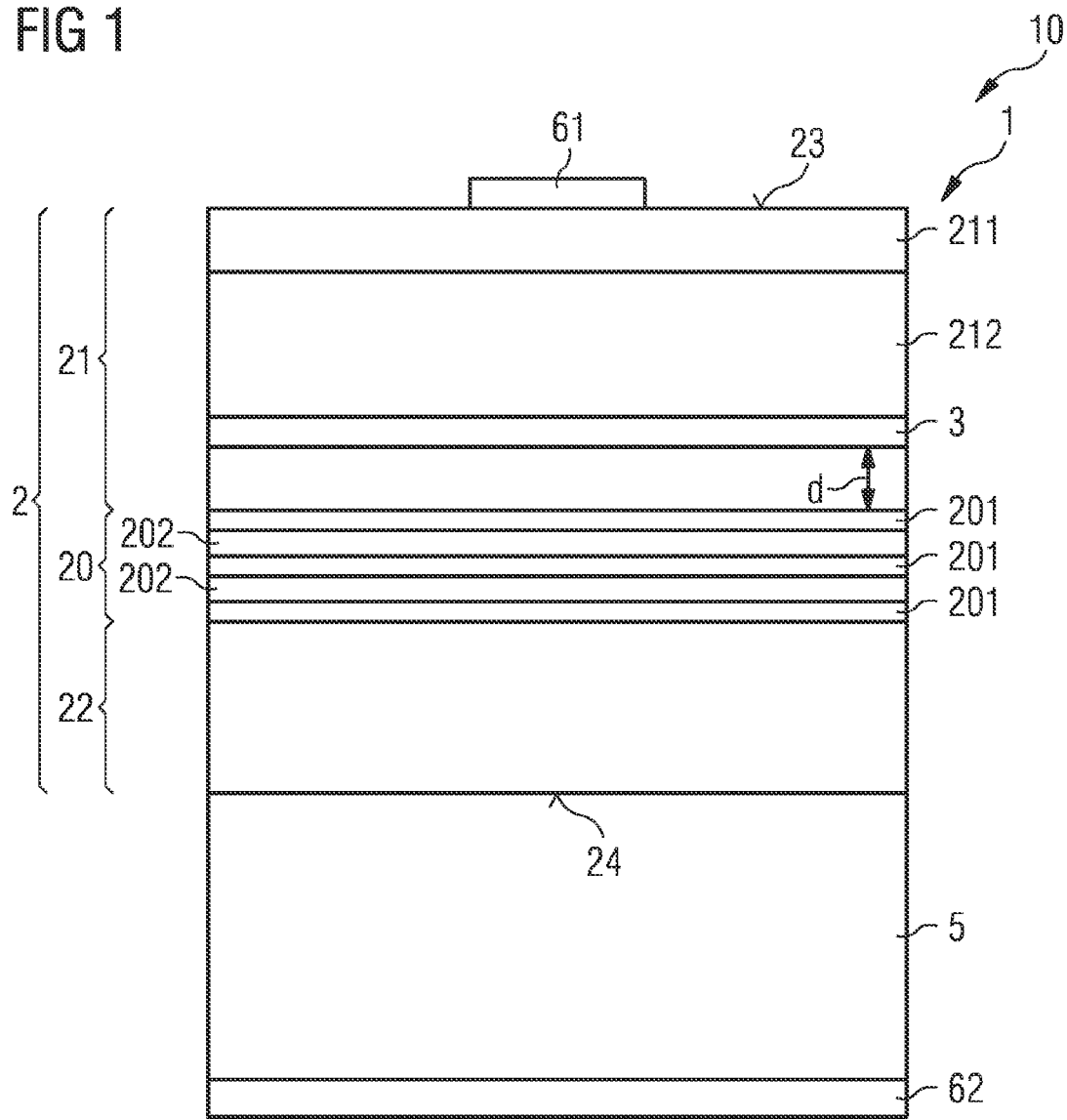

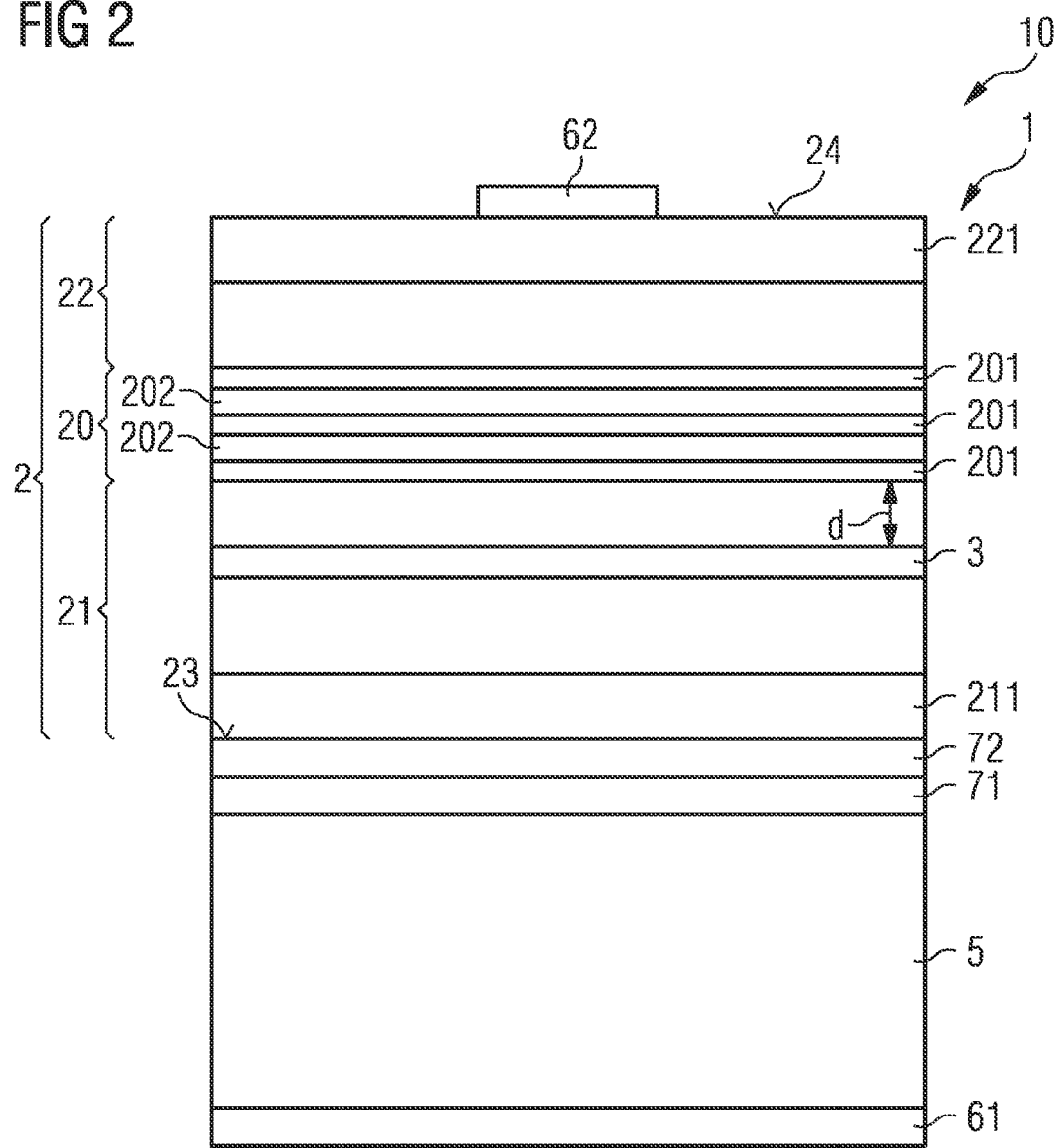

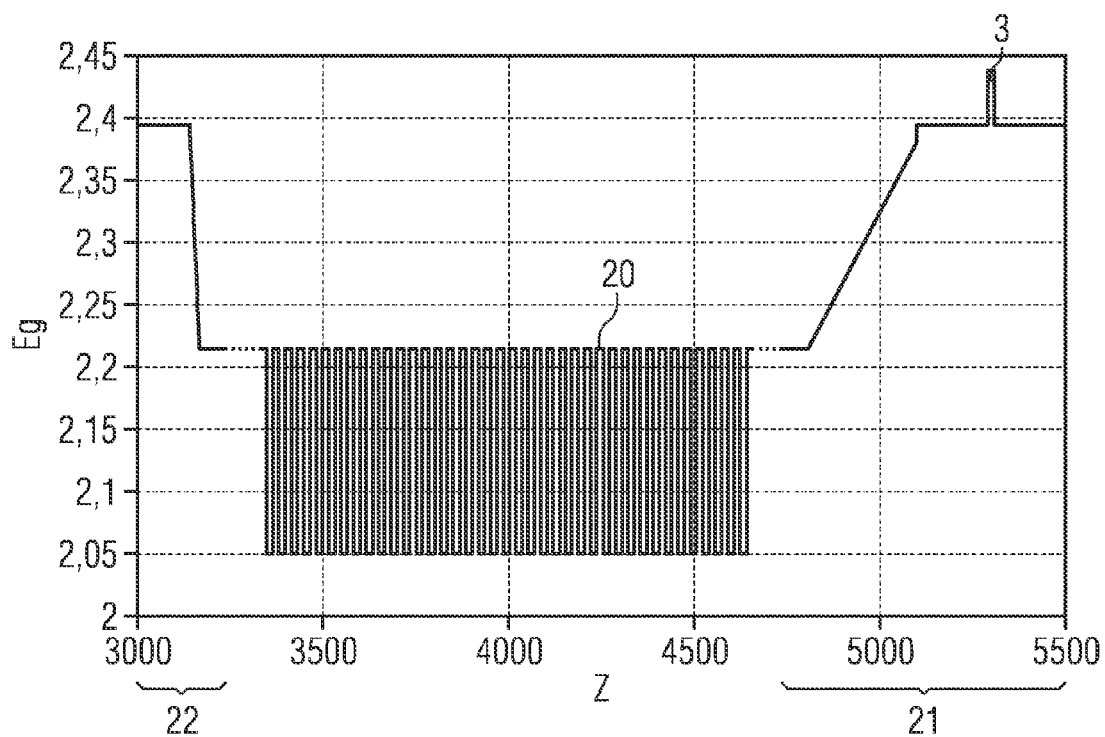

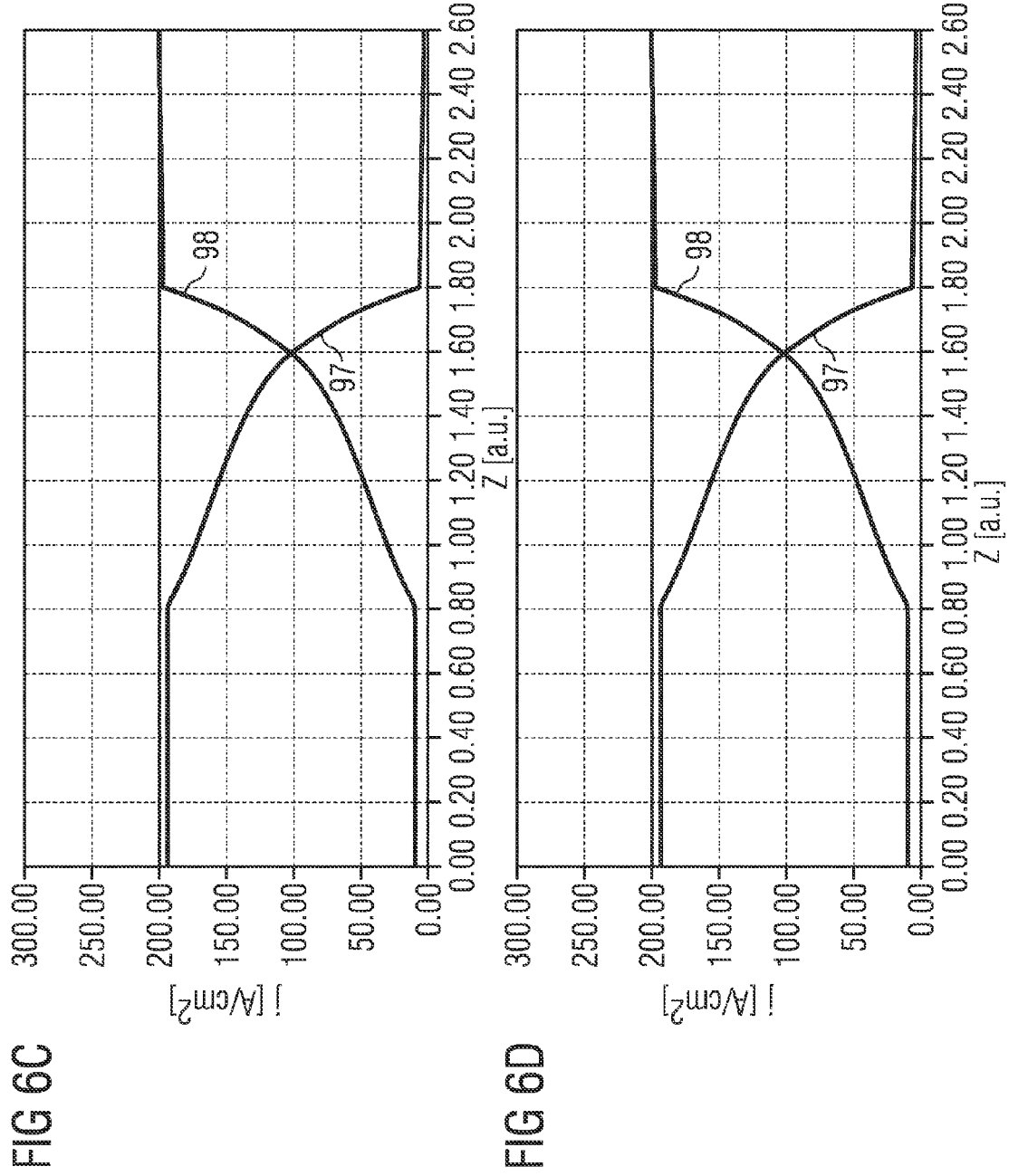

III-V COMPOUND SEMICONDUCTOR-BASED-LIGHT-EMITTING DIODE DEVICE WITH EMBEDDED CHARGE CARRIER BARRIER

TECHNICAL FIELD

This disclosure relates to an optoelectronic semiconductor body and an optoelectronic semiconductor chip.

BACKGROUND

In radiation-emitting components such as light-emitting diodes, leakage currents can constitute a significant loss mechanism that limits the efficiency of the components. For InGaAlP-based light-emitting diodes, it has been found that this loss mechanism occurs to an increased extent toward short wavelengths and moreover intensifies considerably as the operating temperature increases.

There is thus a need to provide for an improved efficiency of the radiation emission.

SUMMARY

We provide an optoelectronic semiconductor body including a semiconductor layer sequence having an active region that generates radiation, a first barrier region and a second barrier region, wherein the active region is arranged between the first barrier region and the second barrier region; and at least one charge carrier barrier layer is arranged in the first barrier region, said at least one charge carrier barrier layer being tensile strained.

We further provide an optoelectronic semiconductor chip including a semiconductor body wherein the semiconductor body is arranged on a carrier.

We yet further provide an optoelectronic semiconductor body including a semiconductor layer sequence having an active region that generates radiation, a first barrier region and a second barrier region, wherein the active region is arranged between the first barrier region and the second barrier region; at least one charge carrier barrier layer is arranged in the first barrier region, said at least one charge carrier barrier layer being tensile strained; and the active region is based on the material system AlxInyGa1 x yP where 0≤x≤1, 0≤y≤1 and x+y≤1 and the charge carrier barrier layer has an Al content x of 0.52≤x≤0.7.

BRIEF DESCRIPTION OF THE DRAWINGS

FIGS. 1 and 2 in each case show an example of a semiconductor chip comprising a semiconductor body in a schematic sectional view.

FIG. 3 shows a schematic profile of the band gap $E_G$ along a deposition direction z in accordance with one example.

FIGS. 6A to 6D show a simulated profile of the current density j along the deposition direction z for semiconductor bodies with a charge carrier barrier layer (FIGS. 6B and 6D) and without a charge carrier barrier layer (FIGS. 6A and 6C) at different operating temperatures.

DETAILED DESCRIPTION

Figure 4A:
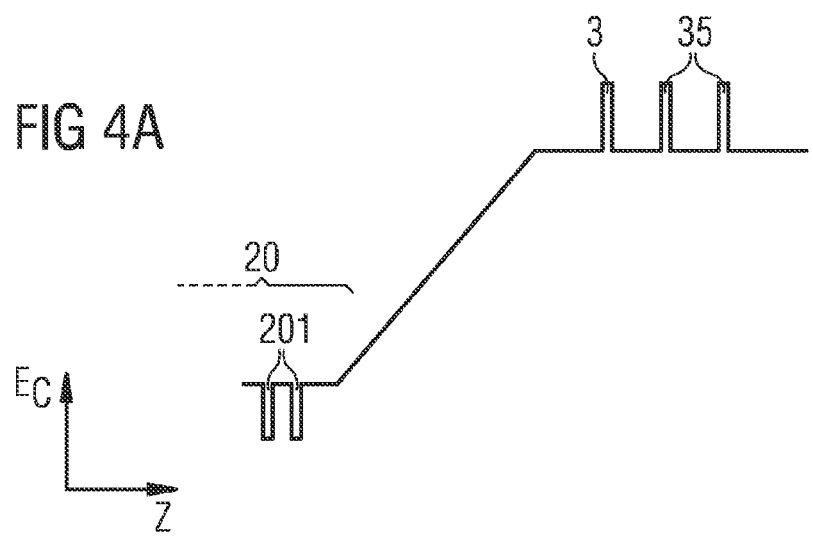
FIGS. 4A to 4C in each case show an excerpt from the conduction band edge profile $E_C$ for different examples.

We provide an optoelectronic semiconductor body that may comprise a semiconductor layer sequence having an active region that generates electromagnetic radiation, a first barrier region and a second barrier region. The active region is arranged between the first barrier region and the second barrier region. Expediently, the first barrier region and the second barrier region differ from one another with regard to the conduction type. By way of example, the first barrier region can be p-conducting and the second barrier region n-conducting, or vice versa. At least one charge carrier barrier layer is arranged in the first barrier region, the at least one charge carrier barrier layer being tensile-strained.

Leakage currents during the operation of the optoelectronic semiconductor body can be efficiently reduced by a tensile-strained charge carrier barrier layer. The efficiency of the optoelectronic semiconductor body is thereby increased.

In a tensile-strained layer, the lattice constant of the layer along a main extension plane of the layer is greater than the intrinsic lattice constant of the material of the layer. Semiconductor layers whose lattice constant is less than their intrinsic lattice constant are analogously designated as compressively strained.

Preferably, a relative lattice mismatch of the charge carrier barrier layer is 0.2% to 1%, particularly preferably 0.3% to 0.7%. The relative lattice mismatch is the ratio of the difference between the lattice constant g of the layer and the intrinsic lattice constant g0 with respect to the intrinsic lattice constant, that is to say (g−g0)/g0.

Such a relative lattice mismatch is particularly suitable in configuring a charge carrier barrier layer such that the latter efficiently reduces leakage currents and at the same time can have a high crystal quality, in particular free of strain-reducing relaxations.

The charge carrier barrier layer can be an electron barrier in a p-conducting first barrier region. Alternatively or supplementary, however, the charge carrier barrier can also be a hole barrier in an n-conducting first barrier region or second barrier region.

Preferably, the active region is based on the compound semiconductor material system $Al_xIn_yGa_{1-x-y}P$ where 0≤x≤1, 0≤y≤1 and x+y≤1. This material system, which is also designated as phosphide semiconductor material hereinafter, is particularly suitable to generate radiation in the yellow to red spectral range.

However, the active region can be based on a different semiconductor material, in particular a different III-V compound semiconductor material. By way of example, nitride semiconductor material ($Al_xIn_yGa_{1-x-y}N$) is suitable to generate radiation in the ultraviolet through the blue into the green spectral range and arsenide compound semiconductor material ($Al_xIn_yGa_{1-x-y}As$) is suitable for the red to infrared spectral range. 0≤x≤1, 0≤y≤1 and x+y≤1 in each case hold true here.

Preferably, the charge carrier barrier layer has a higher aluminum content than the material adjoining on at least one side of the charge carrier barrier layer, particularly preferably than the material adjoining on both sides of the charge carrier barrier layer.

Further preferably, the material adjoining the charge carrier barrier layer should be lattice-matched or substantially lattice-matched relative to gallium arsenide. In this connection, substantially lattice-matched means that the relative lattice mismatch is at most 0.15% in terms of absolute value.

The charge carrier barrier layer may have an aluminum content x of 0.52 to 0.7. In phosphide semiconductor material deposited onto gallium arsenide, the charge carrier barrier layer is therefore tensile-strained relative to gallium arsenide.

The charge carrier barrier layer may have a thickness of 1 nm to 25 nm, particularly preferably 3 nm to 20 nm.

By virtue of a charge carrier barrier layer in this thickness, in particular in conjunction with the relative lattice mismatch indicated above, a charge carrier barrier may be formed which efficiently reduces leakage currents and the thickness of which is below the critical layer thickness. The critical layer thickness for a semiconductor layer is a material-specific upper limit for the growth of a strained semiconductor layer. A reduction of the strain that decreases the crystal quality in the form of dislocations is typical above the critical layer thickness. The smaller the relative lattice mismatch, the larger, typically, the critical layer thickness.

The first barrier region may have at least one further charge carrier barrier layer. The charge carrier barrier layer and the further charge carrier barrier layer constitute a barrier for the same charge type, for example, for electrons in a p-conducting first barrier region.

The charge carrier barrier layer and the further charge carrier barrier layer are preferably at a distance from one another of 3 nm to 200 nm. In particular, the first charge carrier barrier layer and the further charge carrier barrier layer can be at a distance from one another of 50 nm to 200 nm.

Expediently, the further charge carrier barrier layer is likewise tensile-strained. In particular, the further charge carrier barrier layer can have at least one or more of the features mentioned above in connection with the charge carrier barrier layer.

The semiconductor material between the charge carrier barrier layer and the further charge carrier barrier layer can be unstrained. Alternatively, an intermediate layer can be arranged between the charge carrier barrier layer and the further charge carrier barrier layer, the intermediate layer being compressively strained.

The strain of the charge carrier barrier layer can be at least partly compensated for by the compressively strained intermediate layer. Such strain compensation makes it possible to prevent the total strain of the semiconductor material from leading to the formation of dislocations.

Preferably, the further charge carrier barrier layer is further away from the active region than the charge carrier barrier layer and has a higher aluminum content than the charge carrier barrier layer. The further charge carrier barrier layer is therefore more greatly tensile-strained than the charge carrier barrier layer and constitutes a greater charge carrier barrier than the charge carrier barrier layer. The risk of a relaxation and a reduced barrier effect resulting therefrom is increased on account of the greater strain. In such a relaxation, however, a barrier effect for the charge carriers is still ensured by the upstream charge carrier barrier layer having a lower aluminum content.

The active region preferably has a quantum structure having at least one quantum layer. In this case, the term quantum structure does not imply any restriction with regard to the dimensionality of the quantization and encompasses in particular quantum wells, quantum rods and quantum dots.

The charge carrier barrier layer is preferably at a distance of 10 nm to 900 nm, particularly preferably 100 nm to 600 nm, from that quantum layer of the quantum structure which is situated closest to the charge carrier barrier layer.

A particularly efficient barrier effect can be obtained by a charge carrier barrier layer at this distance from the quantum layer.

An optoelectronic semiconductor chip preferably comprises a semiconductor body having the features described above and a carrier, wherein the semiconductor body is arranged on the carrier.

The carrier can be, for example, a growth substrate for the semiconductor layer sequence of the semiconductor body. By way of example, gallium arsenide is suitable as a growth substrate for phosphodic compound semiconductor material.

Alternatively, the carrier can differ from a growth substrate for the semiconductor layer sequence. In this case, the carrier connects to the semiconductor body by a cohesive connection. In a cohesive connection, the preferably prefabricated connection partners are held together by atomic and/or molecular forces. A cohesive connection can be obtained, for example, by a connection means, for instance an adhesive or a solder. In general, separation of the connection is accompanied by destruction of the connection means, and/or of at least one of the connection partners.

The carrier in particular mechanically stabilizes the semiconductor layer sequence. The growth substrate is no longer required for this purpose and can therefore be removed.

A semiconductor chip in which the growth substrate for the semiconductor layer sequence is removed is also designated as a thin-film semiconductor chip. Preferably, a particular metallic mirror layer is arranged between the semiconductor body and the carrier. Radiation generated in the active region and emitted in the direction of the carrier can be reflected at the mirror layer and emerge on a radiation exit surface of the semiconductor chip situated opposite the carrier.

Further features, configurations and expediencies will become apparent from the following description of the examples in association with the figures.

Elements that are identical, of identical type or act identically are provided with the same reference signs in the figures.

The figures and the size relationships of the elements illustrated in the figures among one another should not be regarded as to scale. Rather, individual elements and in particular layer thicknesses may be illustrated with an exaggerated size to enable better illustration and/or to afford a better understanding.

A first example of a semiconductor chip 10 comprising a semiconductor body 1 is illustrated schematically in FIG. 1. The description below is given by way of example on the basis of a luminescence diode, for example, a light-emitting diode having an active region based on phosphide compound semiconductor material, the active region being provided to generate radiation. However, a different III-V compound semiconductor material can also be employed, for example, nitride compound semiconductor material or arsenide compound semiconductor material. The semiconductor chip 10 comprises a semiconductor body 1 arranged on a carrier 5. In this example, the carrier is the growth substrate for the preferably epitaxial deposition of the semiconductor layer sequence 2 of the semiconductor body 1, for example, by MOCVD or MBE. Gallium arsenide, in particular, is suitable as the growth substrate.

The semiconductor layer sequence 2 extends in a vertical direction, that is to say in a direction running perpendicularly to a main extension plane of the semiconductor layers of the semiconductor layer sequence 2, between a first main surface 23 and a second main surface 24 and forms the semiconductor body 1.

The semiconductor layer sequence 2 comprises an active region 20 that generates radiation. The active region 20 has a quantum structure having a plurality of quantum layers 201, wherein a quantum barrier 202 is arranged between adjacent quantum layers. Only three quantum layers are shown for the sake of simplified illustration. However, the number of quantum layers can be varied within wide limits. In particular, the active region can have one to 200 quantum layers.

The semiconductor layer sequence 2 furthermore has a first barrier region 21 and a second barrier region 22. The active region 20 is arranged between the first barrier region and the second barrier region. In the description below, the first barrier region 21 is p-conducting and the second barrier region 22 is n-conducting. The first barrier region 21 extends between the active region and the first main surface 23, and the second barrier region 22 extends between the active region and the second main surface 24. However, the semiconductor body 1 can also be inverted with regard to the conduction type.

The semiconductor chip 10 furthermore comprises a first contact 61 and a second contact 62. By applying an electrical voltage between the contacts charge carriers may be injected into the active region 20 from opposite sides and recombine there with emission of radiation.

The first barrier region 21 has a charge carrier barrier layer 3. The charge carrier barrier layer 3 is tensile-strained. In contrast thereto, the material of the first barrier region that adjoins both sides of the charge carrier barrier layer is unstrained. In a gallium arsenide growth substrate, for example phosphide compound semiconductor material is suitable, in particular phosphide compound semiconductor material having an aluminum content of 48% to 51% and correspondingly an indium content of 52% to 49%.

In particular, the material adjoining the charge carrier barrier layer 3 can be free of gallium or substantially free of gallium, that is to say with a gallium content of at most 5%.

In the example shown, the first barrier region 21 has a main region 212 and a contact region 211. The contact region 211 forms the first main surface 23. The charge carrier barrier layer 3 is arranged within the main region 212.

The contact region 211 can be based on arsenide compound semiconductor material. The contact region 211 can also be multilayered. In particular, the material directly adjoining the main surface 23 can consist of p-doped gallium arsenide.

An ohmic contact with respect to the first contact 61 can thus be obtained in a simplified manner. In a departure from this, however, such a contact region composed of arsenide compound semiconductor material can also be dispensed with.

The vertical extent of the main region 212 is preferably at least double the magnitude of the vertical extent of the contact region 211.

The relative lattice mismatch of the tensile-strained charge carrier barrier layer 3 is preferably 0.2% to 1%, in particular 0.3% to 0.7%.

The thickness of the charge carrier barrier layer is preferably 1 nm to 5 nm, particularly preferably 3 nm to 20 nm.

Preferably, the relative lattice mismatch of the charge carrier barrier layer 3 and the thickness of the charge carrier barrier layer are coordinated with one another such that the charge carrier barrier layer does not exceed the critical layer thickness. The smaller the relative lattice mismatch, therefore, the larger the thickness of the charge carrier barrier layer can be, and vice versa.

A distance d between that quantum layer 201 of the active region 20 situated closest to the barrier region 21 and the charge carrier barrier layer 3 is preferably 10 nm to 900 nm, particularly preferably 100 nm to 600 nm.

The semiconductor material of the first barrier region 21 need not necessarily be deposited in a continuously p-conductively doped manner. By way of example, a partial region, in particular the charge carrier barrier layer 3, can be grown in a nominally undoped manner. A doping of the layer deposited in a nominally undoped manner can be established by back-diffusion of the subsequently deposited semiconductor material.

The p-type doping of the first barrier region 21 can be effected by magnesium and/or carbon, for example. In particular, the main region 212 can be doped with magnesium and the contact region 211 can be doped with carbon. Tellurium or silicon, for example, is suitable for an n-type doping.

The charge carrier barrier layer 3 preferably has a higher aluminum content than the material adjoining both sides of the charge carrier barrier layer. In particular, the aluminum content can be 0.52 to 0.7. The higher the aluminum content, the larger, typically, the band gap $E_G$ of the material.

In a p-conducting first barrier region 21, the charge carrier barrier layer 3 is an electron barrier. The proportion of electrons which traverses the active region without radiative recombination in the active region 20 and passes to the first contact 61 can be reduced by the electron barrier.

We found that an efficient electron barrier can be formed by the tensile-strained charge carrier barrier layer described, even if the tensile strain can slightly counteract the barrier effect.

In addition, we found that positioning of the charge carrier barrier layer 3 in a region which is heavily doped, for instance with a doping of at least $1*10^{18}$ cm$^{-3}$, constitutes a comparatively great barrier for minority charge carriers, that is to say for electrons in a p-conducting region, and at the same time a comparatively small barrier for the majority charge carriers, that is to say holes in the p-conducting region. The band discontinuities at the transition between the charge carrier barrier layer and the adjoining material of the first barrier region 21 therefore occur predominantly in the conduction band.

Furthermore, a comparatively heavy doping in that material of the first barrier region 21 which adjoins the charge carrier barrier layer 3 has the effect that the depletion zone in the region of the band discontinuities is small and the Fermi level is near the band edge.

In a departure from the configuration described, the first barrier region 21 can also be n-conducting. In this case, the charge carrier barrier layer 3 formed in the first barrier region is a hole barrier. Moreover, in addition to the charge carrier barrier layer in the first barrier region 21, a charge carrier barrier layer can also be formed in the second barrier region 22. In this case, the semiconductor body can comprise both an electron barrier and a hole barrier.

The second example illustrated in FIG. 2 substantially corresponds to the example described in connection with FIG. 1. In contrast thereto, the carrier 5 differs from a growth substrate for the semiconductor layer sequence 2. The carrier 5 in particular mechanically stabilizes the semiconductor layer sequence 2 such that the growth substrate is no longer required for this purpose and can be removed. The semiconductor chip 10 is, therefore, a thin-film semiconductor chip.

The semiconductor layer sequence 2 is cohesively fixed to the carrier 5 by a connection layer 71, for example, by a solder layer or an electrically conductive adhesive layer.

A mirror layer 72 is arranged on the first main surface 23 of the semiconductor layer sequence 2 and reflects radiation generated in the active region 20 and emitted in the direction of the carrier 5. The emission from the semiconductor chip takes place predominantly, preferably to the extent of at least 70%, through the second main surface 24 of the semiconductor body 1 facing away from the carrier 5.

Furthermore, in contrast to the first example, the second barrier region 22 has a contact region 221 adjoining the second main surface 24. The contact region 221 can be based on arsenide compound semiconductor material. However, such a contact region can also be dispensed with.

A schematic profile of the band gap $E_G$ along the deposition direction z, that is to say along the vertical direction, is illustrated schematically in FIG. 3. In the example shown, the active region 20 has a multiplicity of quantum layers, for example, one hundred quantum layers, and so the individual quantum layers cannot be resolved individually in the figure.

The charge carrier barrier layer 3 has a higher aluminum content and thus a higher band gap than the semiconductor material adjoining the charge carrier barrier layer 3 on both sides.

The semiconductor material of the first barrier region 21 adjoining the charge carrier barrier layer 3 on both sides has a greater aluminum content and thus a larger band gap than the quantum barriers 202 of the active region 20.

The first barrier region 21 therefore itself already constitutes a charge carrier barrier, wherein the barrier effect is increased more extensively by the tensile-strained charge carrier barrier layer 3. On account of the configuration of the charge carrier barrier layer 3 below the critical layer thickness, an improvement in the barrier effect for electrons in the p-conducting first barrier region 21 may be obtained without a reduction in the material quality on account of relaxations.

Figure 4B:
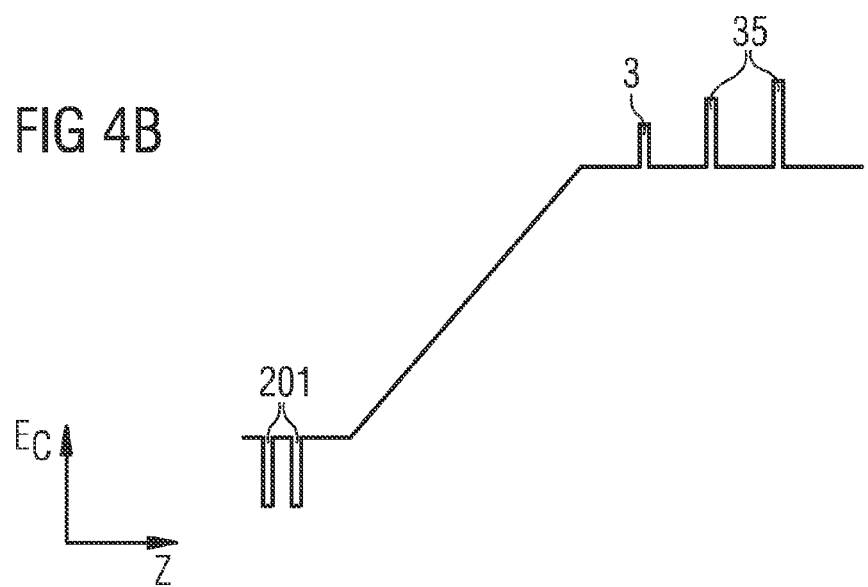
Figure 4C:
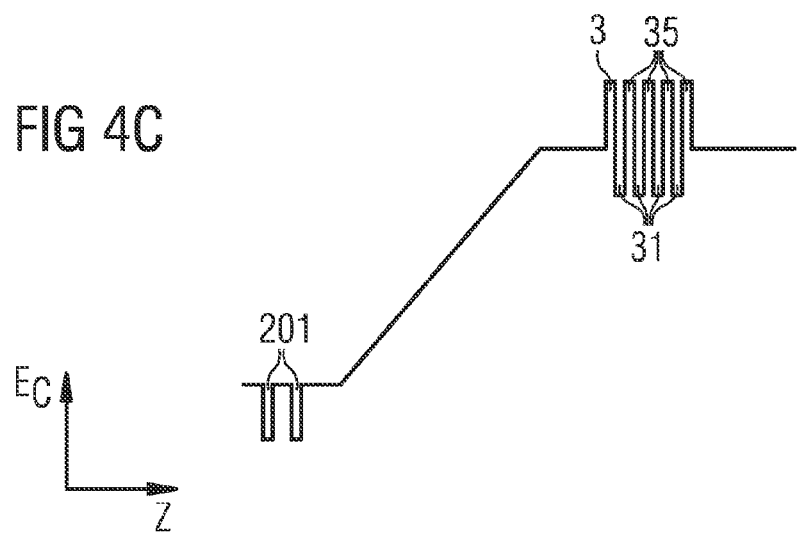

FIGS. 4A to 4C schematically illustrate the band edge profile $E_C$ of the conduction band in an excerpt revealing in each case a part of the active region 20 and the charge carrier barrier layer 3.

In the example illustrated in FIG. 4A, the first barrier region 21 has two further charge carrier barrier layers 35 in addition to the charge carrier barrier layer 3. A distance between the charge carrier barrier layers is preferably 3 nm to 200 nm, particularly preferably 50 nm to 200 nm.

The charge carrier barrier layer 3 and the further charge carrier barrier layers 35 in the example are such that they are identical, in particular with regard to the aluminum content and their strain. The barrier effect is improved by the increase in the number of charge carrier barrier layers.

In contrast to the configuration of identical type, the charge carrier barrier layers in the example illustrated in FIG. 4B have a higher aluminum content and thus a higher degree of the tensile strain with increasing distance from the active region 20.

The higher the aluminum content, the greater the extent to which the charge carrier barrier layer 3 and the further charge carrier barrier layers 35 can fulfill the function of an electron barrier. However, there is also an increase in the risk of the critical layer thickness being exceeded during production and the strain thereby being reduced in the form of relaxations. Preferably, the charge carrier barrier layer 3 with the lowest aluminum content is such that the critical layer thickness of the charge carrier barrier layer is not exceeded even in process fluctuations. If the charge carrier barrier layers 35 having a higher aluminum content that are further away from the active region relax, then a charge carrier barrier effect is ensured at least by the charge carrier barrier layer 3 situated closest to the active region.

In the example illustrated in FIG. 4C, an intermediate layer 31 is arranged between adjacent charge carrier barrier layers 3, 35, wherein the intermediate layers are compressively strained. These intermediate layers compensate for the strain of the tensile-strained charge carrier barrier layers 3, 35, such that the sum of the layer thicknesses of the charge carrier barrier layers 3, 35 can also be above the critical layer thickness. The thickness of the intermediate layers 31 and thus a distance between adjacent charge carrier barrier layers is preferably 1 nm to 100 nm, particularly preferably 3 nm to 40 nm. Given a thickness of the intermediate layer 31 of at most 10 nm, quantum effects can additionally be utilized.

Figure 5:
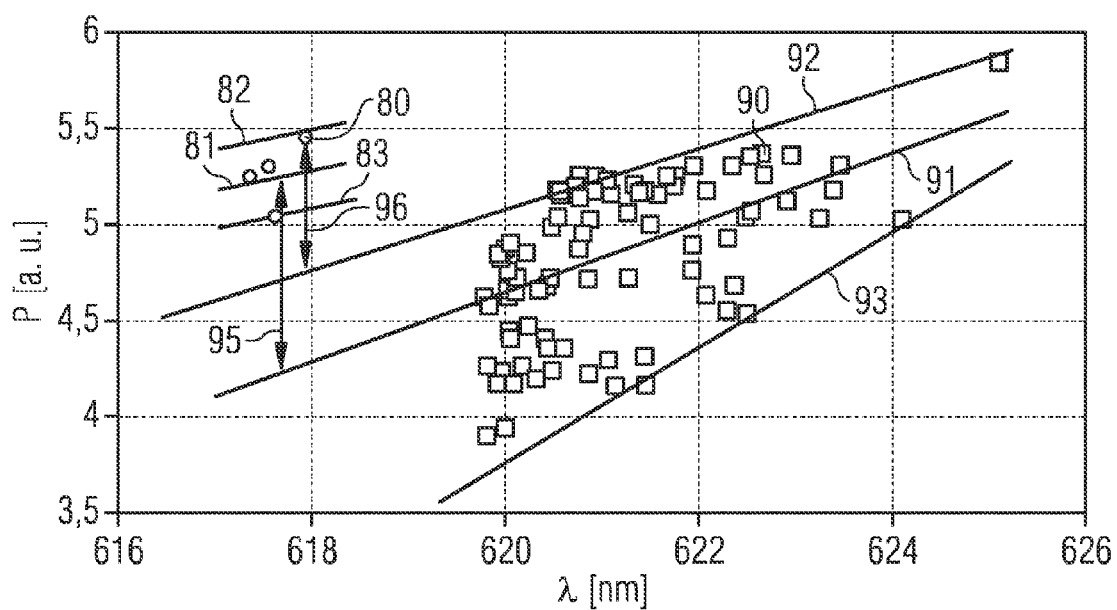
FIG. 5 shows measurements of the emitted radiation power for different semiconductor chips, emitting with an emission wavelength X, with a charge carrier barrier layer and without a charge carrier barrier layer.

Measurement results of the radiation power P for different semiconductor chips are shown in FIG. 5, wherein the measurement values 80 relate to semiconductor bodies having a charge carrier barrier layer and the measurement values 90 relate to semiconductor bodies without a charge carrier barrier layer. The thickness of the charge carrier barrier layer is 15 nm in each case.

The measurements were carried out at a temperature of 100° C. Since the radiation power P is also dependent on the emission wavelength λ, wavelength-dependent straight lines as upper limits 82 and 92, respectively, lower limits 83 and 93, respectively, and mean values 81 and 91, respectively, are plotted for the measurement values. If the mean values are compared, represented by arrow 95, then an increase in the radiation power of 23% results. In a comparison of the upper limits, represented by arrow 96, the increase is 14%. Even in a comparison of the mean value of the four semiconductor bodies having a charge carrier barrier layer with the upper limit 92 for semiconductor bodies without a charge carrier barrier layer, an increase of 10% still results. The measurements therefore prove that the efficiency of the semiconductor chips can be significantly increased by means of the charge carrier barrier layer 3.

Figure 6A:
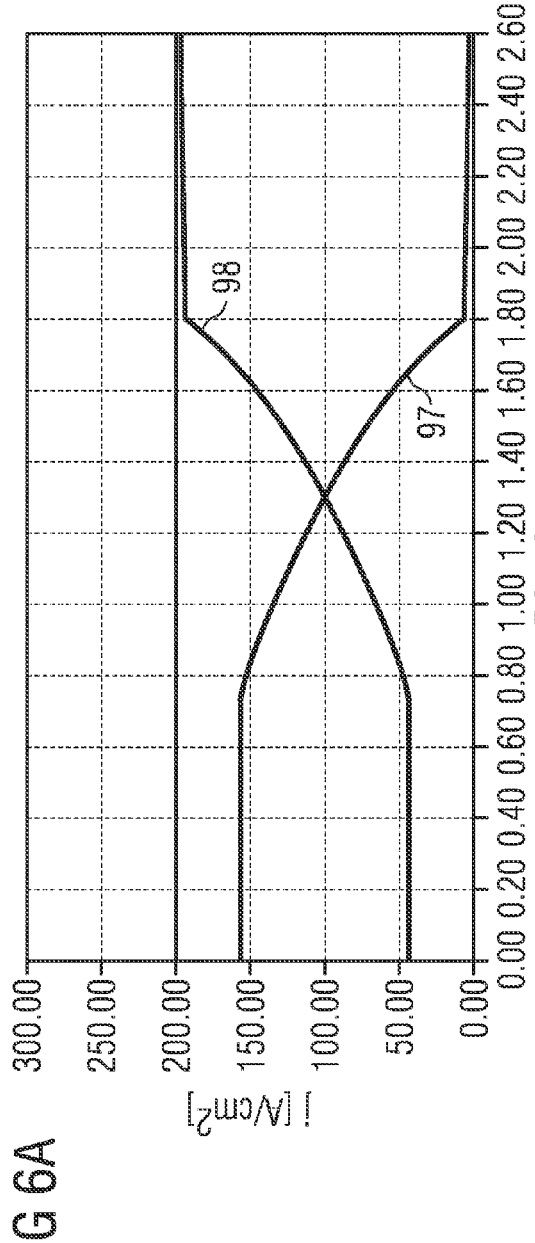

FIGS. 6A to 6D show simulation results for the profile of the current density j along the deposition direction z. A semiconductor layer sequence having an active region having 20 quantum wells and an emission wavelength of 600 nm was taken as a basis for the simulations. The simulations relate to a current density j of 200 A/cm$^2$ at a temperature of 100° C. (FIGS. 6A and 6B) and 20° C. (FIGS. 6C and 6D).

Figure 6B:
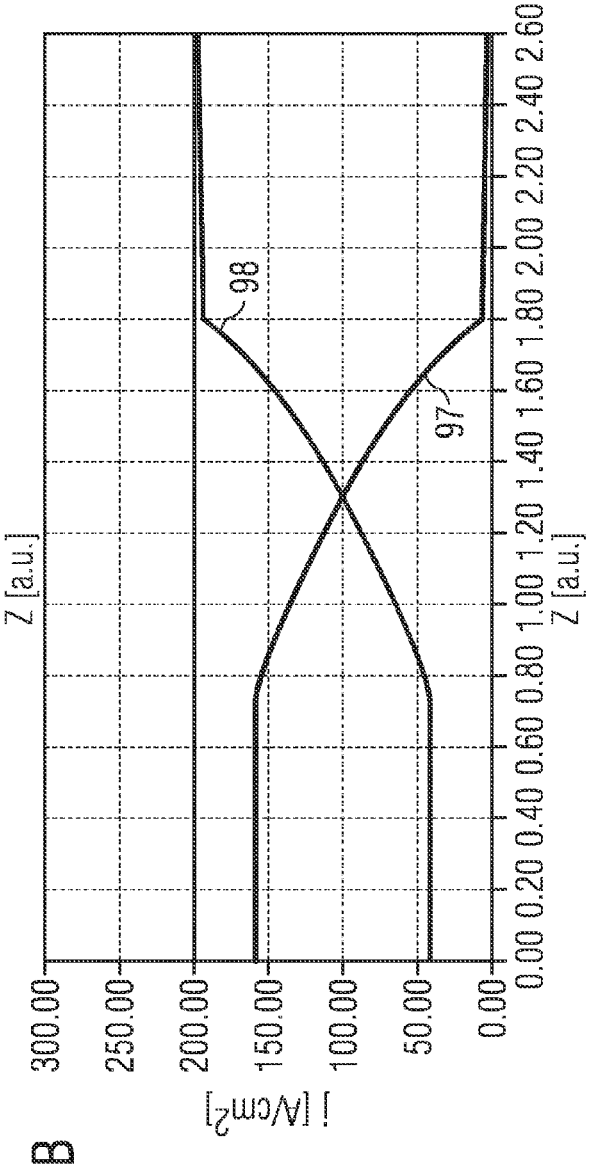

FIGS. 6A and 6C show a comparison structure without a charge carrier barrier and FIGS. 6B and 6D relate to a structure comprising a tensile-strained 10 nm thick charge carrier barrier layer as an electron barrier having a band gap that is 40 meV greater than the band gap of the adjoining material of the first barrier region.

The curves 97 and 98 show the current density for holes and electrons, respectively. The value of the curve 98 for z=0 divided by the current density of 200 A/cm$^2$ taken as a basis in each case represents that proportion of the electrons which traverses the active region without recombination and thus makes no contribution to the radiation emission. If these values are compared, then said proportion can be reduced from 23.3% to 20.9% at a temperature of 100° C. and from 3.8% to 3.2% at a temperature of 20° C. by the charge carrier barrier layer 3. Assuming direct proportionality of the increase in efficiency with respect to the reduced leakage current, therefore, an increase of approximately 3% would result at 100° C. For the actually expected increase in the emitted radiation power, however, the so-called photon recycling factor should also be taken into account. This factor indicates how often a photon is absorbed and re-emitted before it leaves the semiconductor material. Given a decrease in the losses from 23.3% to 20.9% and a typical photon recycling factor of approximately 5, therefore, on the basis of the simulations, an increase in the efficiency by a factor of $((1-0.209)/(1-0.233))^5=1.17$, that is to say by approximately 17%, should be expected.

The simulations therefore prove in accord with the measurements illustrated in FIG. 5 that the efficiency of the generation of radiation can be considerably improved by the provision of a tensile-strained charge carrier barrier layer. Moreover, the improvement can be obtained without significant changes having to be made to the rest of the production method for the semiconductor chips.

Our semiconductor bodies and chips are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic semiconductor body comprising a semiconductor layer sequence having an active region that generates radiation, a first barrier region and a second barrier region, wherein:
   the active region is arranged between the first barrier region and the second barrier region;
   at least one charge carrier barrier layer is arranged in the first barrier region, the at least one charge carrier barrier layer being tensile-strained, and
   the active region is based on the material system $Al_xIn_yGa_{1-x-y}P$ where $0 \leq x \leq 1$, $0 \leq y \leq 1$ and $x+y \leq 1$ and the charge carrier barrier layer has an Al content x of $0.52 \leq x \leq 0.7$.

2. The optoelectronic semiconductor body according to claim 1, wherein a relative lattice mismatch of the charge carrier barrier layer is 0.2% to 1%.

3. The optoelectronic semiconductor body according to claim 1, wherein the charge carrier barrier layer has a higher Al content than the material adjoining on both sides of the charge carrier barrier layer.

4. The optoelectronic semiconductor body according to claim 1, wherein the material adjoining the charge carrier barrier layer is free of gallium or has a gallium content of at most 5%.

5. The optoelectronic semiconductor body according to claim 1, wherein the charge carrier barrier layer has a thickness of 1 nm to 25 nm.

6. The optoelectronic semiconductor body according to claim 1, wherein the first barrier region has at least one further tensile-strained charge carrier barrier layer.

7. The optoelectronic semiconductor body according to claim 6, wherein the first charge carrier barrier layer and the further charge carrier barrier layer are at a distance from one another of 3 nm to 200 nm.

8. The optoelectronic semiconductor body according to claim 6, wherein the first charge carrier barrier layer and the further charge carrier barrier layer are at a distance from one another of 50 nm to 200 nm.

9. The optoelectronic semiconductor body according to claim 6, wherein the first charge carrier barrier layer and the further charge carrier barrier layer are at a distance from one another of 3 nm to 100 nm.

10. The optoelectronic semiconductor body according to claim 6, wherein the further charge carrier barrier layer is further away from the active region than the charge carrier barrier layer and has a higher Al content than the charge carrier barrier layer.

11. The optoelectronic semiconductor body according to claim 6, wherein an intermediate layer is arranged between the charge carrier barrier layer and the further charge carrier barrier layer, said intermediate layer being compressively strained.

12. The optoelectronic semiconductor body according to claim 1, wherein the active region has a quantum structure having at least one quantum layer and the charge carrier barrier layer is at a distance of 10 nm to 900 nm from that quantum layer of the quantum structure which is situated closest to the charge carrier barrier layer.

13. An optoelectronic semiconductor chip comprising a semiconductor body according to claim 1, wherein the semiconductor body is arranged on a carrier.

14. The optoelectronic semiconductor chip according to claim 13, wherein a metallic mirror layer is arranged between the semiconductor body and the carrier.

* * * * *